United States Patent
Ying et al.

(10) Patent No.: US 6,541,380 B2
(45) Date of Patent: Apr. 1, 2003

(54) PLASMA ETCHING PROCESS FOR METALS AND METAL OXIDES, INCLUDING METALS AND METAL OXIDES INERT TO OXIDATION

(75) Inventors: Chentsau Ying, Cupertino, CA (US); Jeng H. Hwang, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/912,579

(22) Filed: Jul. 24, 2001

(65) Prior Publication Data

US 2003/0022494 A1 Jan. 30, 2003

(51) Int. Cl.[7] ............................................. H01L 21/302
(52) U.S. Cl. ...................... 438/689; 438/704; 438/710; 438/683
(58) Field of Search .................. 438/689, 704, 438/710, 711, 715, 720, 722, 724, 742, 738, 650, 686, 3, 256, 239, 597, 683

(56) References Cited

U.S. PATENT DOCUMENTS 6,143,476 A * 11/2000 Ye et al. ...................... 438/318
2002/0006674 A1 * 1/2002 Ma et al. ........................ 438/3

FOREIGN PATENT DOCUMENTS

| DE | 197 28 473 | 1/1999 | ........... H01L/21/28 |
| EP | 0 865 079 | 9/1998 | ....... H01L/21/3213 |
| JP | 10 340893 | 12/1998 | ....... H01L/21/3065 |
| JP | 11 031682 | 2/1999 | ....... H01L/21/3065 |
| WO | WO 00/49650 | 8/2000 | ....... H01L/21/3213 |

OTHER PUBLICATIONS

Jim Hong Kim et al., "Anisotropic Etching Characteristics of Platnium Electrode for Ferrooelectric Capacitor," IEEE Transactions on Electron Devices, vol. 45, No. 5m May 1999, pp. 984–992.

* cited by examiner

*Primary Examiner*—Olik Chaudhuri
*Assistant Examiner*—Yennhu B. Huynh
(74) *Attorney, Agent, or Firm*—Mayer, Fortkort, & Williams; Joseph Bach

(57) ABSTRACT

A method of etching a metal or metal oxide, including a platinum family metal or a platinum family metal oxide. A wafer is first provided which comprises: (a) a semiconductor substrate, (b) a metal or metal oxide layer over the semiconductor substrate, and (c) a titanium containing patterned mask layer having one or more apertures formed therein positioned over the metal or metal oxide layer. The metal or metal oxide is then etched through the apertures in the mask layer by a plasma etching step that uses plasma source gases comprising the following: (a) a gas that comprises one or more carbon-oxygen bonds (for example, CO gas or $CO_2$ gas) and (b) a gas that comprises one or more chlorine atoms (for example, $Cl_2$ gas, carbon tetrachloride gas, silicon tetrachloride gas or boron trichloride gas).

25 Claims, 2 Drawing Sheets

PLASMA ETCHING PROCESS FOR METALS AND METAL OXIDES, INCLUDING METALS AND METAL OXIDES INERT TO OXIDATION

BACKGROUND OF THE INVENTION

1. Field of the Invention

This invention relates to plasma etching of metals and metal oxides, particularly platinum-family metals and metal oxides.

2. Brief Description of the Background Art

There is presently demand for processes by which metals and metal oxides can be etched, particularly those metals and metal oxides that are both conductive and relatively inert to oxidation.

For example, in the field of semiconductor integrated circuits, digital information storage and retrieval technology plays an important role in the advancement of modem digital electronics. Memory size and access time frequently serve as measures of progress in this technology. Present state-of-the-art memory devices include small-feature-size high-density dynamic random access memory (DRAM) devices, which use high-capacitance storage capacitors containing high dielectric constant materials as memory array elements. The high dielectric constant materials, or ferroelectric materials, are made primarily of sintered metal oxide and contain a substantial amount of highly reactive oxygen. To form storage capacitors with such ferroelectric materials, the electrodes should be composed of materials with reactivities that are sufficiently low to prevent oxidation of the electrodes, which oxidation would decrease the capacitance of the storage capacitors. Therefore, platinum family metals (i.e., platinum, iridium, ruthenium, palladium, rhodium and osmium) and their conductive oxides are preferred materials for use in the manufacture of capacitors for high-density DRAM devices.

Etching such materials poses various new challenges. For example, commonly assigned WO 00/49650 discloses a technique for etching a layer of platinum or iridium within a wafer by heating it, while exposing it to a high-density inductively coupled plasma of an etching gas that comprises chlorine, oxygen and argon. Although such chemistry is effective to etch electrodes with desirable properties (e.g., small feature sizes and substantially vertical sidewalls), the by-products of this process can be quite difficult to remove from the inside surfaces of the reactor chamber, frequently requiring very aggressive removal measures. For example, aqua regia (i.e., a mixture of nitric acid and hydrochloric acid) is typically used to remove the by-product deposits from the chamber surfaces. Furthermore, the by-product deposits have significant conductivity, which is problematic with respect to dielectric reactor components (e.g., dielectric ceilings of inductively coupled plasma reactors), because the dielectric properties of these components are degraded upon deposition of the conductive material, causing etch rate instability, among other effects.

SUMMARY OF THE INVENTION

The above and other drawbacks associated with the prior art are addressed by the processes of the present invention. According to an embodiment of the invention, a method is provided which comprises: (1) providing a wafer, which wafer further comprises (a) a semiconductor substrate, (b) a metal or metal oxide layer over the semiconductor substrate, and (c) a titanium containing patterned mask layer having one or more apertures formed therein positioned over the metal or metal oxide layer; and (2) etching the metal or metal oxide layer through the apertures in the mask layer by a plasma etching step, which is conducted using plasma source gases comprising the following: (a) a gas that comprises one or more chlorine atoms and (b) a gas that comprises one or more carbon-oxygen bonds.

The gas that comprises one or more carbon-oxygen bonds is preferably CO gas and/or $CO_2$ gas, while the gas that comprises one or more chlorine atoms is preferably $Cl_2$ gas, carbon tetrachloride gas, silicon tetrachloride gas and/or boron trichloride gas.

In some preferred embodiments, the gas that comprises one or more carbon-oxygen bonds is CO gas, while the gas that comprises one or more chlorine atoms is $Cl_2$ gas. In this instance, the ratio of CO gas to $Cl_2$ gas preferably ranges from 1:1 to 15:1.

In other preferred embodiments, the plasma source gases further comprise $O_2$ gas, $N_2$ gas or both. Where present, the $O_2$ gas is preferably provided in an amount ranging from 0.1% to 20% and the $N_2$ is provided in an amount ranging from 0.1% to 10%.

In still other preferred embodiments, the plasma source gases further comprise one or more noble gases selected from argon gas, krypton gas and xenon gas.

The plasma-etching step is preferably conducted in a high-density plasma at a pressure ranging from 5 to 50 mTorr. Wafer temperatures preferably range from 250 to 550° C. during the plasma-etching step.

The following materials are preferred: (1) the semiconductor substrate is preferably a silicon substrate, (2) the metal or metal oxide layer preferably comprises one or more metals selected from platinum, iridium, ruthenium, palladium, rhodium and osmium, or one or more metal oxides selected from iridium oxide and ruthenium oxide, and (3) the titanium containing mask layer preferably comprises one or more compounds selected from titanium metal, titanium oxide and titanium nitride.

In some embodiments, the wafer further comprises: (a) a semiconductor oxide layer disposed on he semiconductor substrate, and (b) a barrier layer disposed between the semi conductor oxide layer and the patterned masking layer, wherein the barrier layer is preferably selected from a titanium layer and a titanium nitride layer.

According to yet another embodiment of the invention, a method is provided which comprises: (1) providing a wafer that comprises (a) a semiconductor substrate, (b) a platinum family metal layer over the semiconductor substrate, and (c) a patterned masking layer having one or more apertures formed therein which comprises titanium, titanium oxide or titanium nitride positioned over the platinum family metal layer; and (2) etching the platinum family metal layer through the apertures in the mask layer by a plasma etching step that is conducted using plasma source gases comprising $Cl_2$ gas and CO gas. In this embodiment, the wafer is heated to a temperature ranging from 250 to 550° C.

One advantage of the present invention is that a method is provided by which metals and metal oxides, including platinum family metals and metal oxides, can be etched.

Another advantage of the present invention is that such materials can be etched while providing (a) acceptable selectivity with respect to the masking layer, (b) good etch rate stability, and (c) repeatable and relatively vertical etching profiles.

Another advantage of the present invention is that a method is provided in which metals and metal oxides, including platinum family metals and metal oxides, can be etched while providing by-products that have very low conductivity.

Yet another advantage of the present invention is that a method is provided in which metals and metal oxides, including platinum family metals and metal oxides, can be etched while at the same time providing by-products that can be easily removed from interior reactor surfaces.

The above and other embodiments and advantages of the present invention will become immediately apparent to those of ordinary skill in the art upon reading the detailed description and claims to follow.

DETAILED DESCRIPTION OF PREFERRED EMBODIMENTS OF THE INVENTION

Figure 1A:
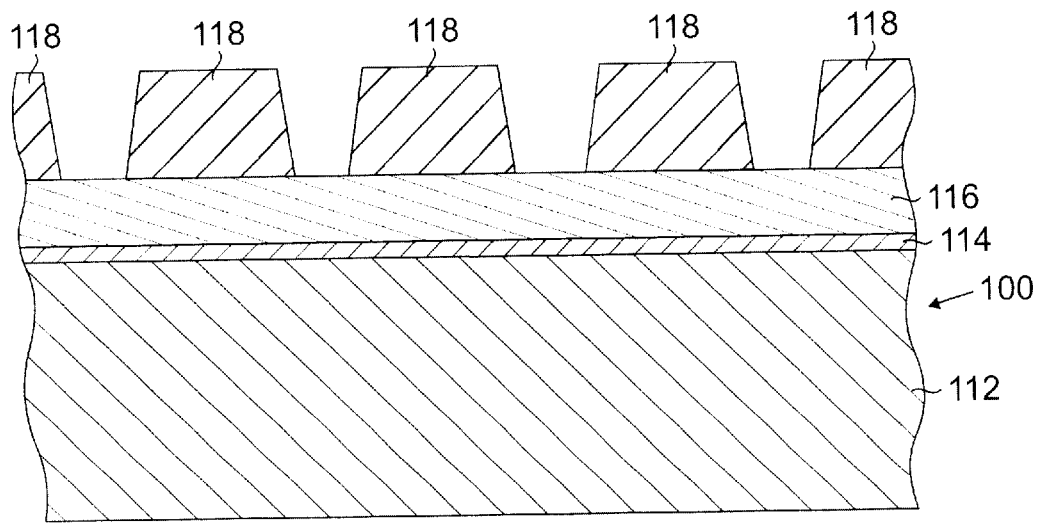
FIGS. 1A and 1B are schema tic partial cross-sectional views illustrating the etching of a wafer according to an embodiment of the invention.

As a preface to the detailed description, it should be noted that, as used in this specification and the appended c aims, the singular forms "a", "an", and "the" include plural referents, unless the context clearly dictates otherwise.

All percentages (%) listed f r gas constituents are % by volume, and all ratios listed for gas constituents are volume ratios.

The term "selectivity" is used to refer to a) a ratio of etch rates of two or more materials and b) a condition achieved during etch when etch rate of one material is substantially different from another material.

The present invention now will be described more fully hereinafter with reference to the accompanying drawings, in which preferred embodiments of the invention are shown. This invention may, however, be embodied in different forms and should not be construed as limited to the embodiments set forth herein.

One preferred embodiment of the present invention will now be discussed in connection with FIG. 1A in which there is shown a wafer, generally illustrated as 100. The wafer 100 includes a semiconductor substrate 112. A barrier layer 114 is disposed over the semiconductor substrate 112, and a metal or metal oxide layer 116 is disposed over the barrier layer 114. Over the metal or metal oxide layer 116 is disposed a patterned masking layer 118 (also referred to herein as a mask layer). The wafer 100 will typically also include, for example, regions of circuit elements that do not appear in the drawings.

The semiconductor substrate 112 may comprise any desired semiconductor, including elemental semiconductors, such as silicon and germanium, and compound semiconductors, such as III–V semiconductors (e.g., gallium arsenide) and II–VI semiconductors (e.g., cadmium telluride). The semiconductor substrate 112 can comprise single crystal, polycrystalline and/or amorphous regions, and it can comprise doped and/or undoped regions. Silicon is a beneficial semiconductor substrate 112 material. Frequently, the silicon has an oxide layer at its surface (not shown), which interfaces with the barrier layer 114. As a specific example, a silicon substrate may be provided with a silicon dioxide layer (having a thickness, for example, of about 5000 Angstroms) using thermal oxidation.

Barrier layer 114 is typically placed between the metal or metal oxide layer 116 and the semiconductor substrate 112 in order to prevent species from the metal or metal oxide layer 116 from diffusing into and/or reacting with certain elements (for example, polysilicon regions) within the semiconductor substrate 112. The barrier layer 114 further functions to couple the semiconductor substrate 112 to the metal or metal oxide layer 116. The barrier layer 114 may be of any suitable thickness. Preferably, the barrier layer 114 comprises titanium and/or a titanium compound, such as titanium nitride, and has a thickness ranging from about 50 Angstroms to about 600 Angstroms, more preferably from about 300 Angstroms to about 500 Angstroms. RF magnetron sputtering is a preferred method for providing the barrier layer 114 over the semiconductor substrate 112.

Preferably, the metal or metal oxide layer 116 includes one or more of the following: (a) a platinum family me al, specifically, platinum, iridium, ruthenium, palladium, rhodium or osmium, (b) a conductive oxide of a platinum family metal, including an oxide of iridium or ruthenium, (c) another metal such as cobalt, nickel or iron, and (d) another metal oxide such as lead-zirconium-titanium oxide (which, in contrast to the above, is a dielectric material). More preferred materials for use as the metal or metal oxide layer 116 are iridium, platinum, iridium-platinum alloys, iridium oxide, and ruthenium oxide, with platinum and iridium being most preferred. These materials are preferred for many applications, because they are good conductors, they are inert to oxidation, and they are known to have low leakage currents ($<10^{-9}$ amps/cm$^2$).

The thickness of the metal or metal oxide layer 116 will depend upon the end use of the device that is to contain the metal or metal oxide layer 116. For example, in certain preferred embodiments pertaining to storage devices, the thickness of the metal or metal oxide laser 116 ranges from about 500 Angstroms to about 4000 Angstroms, more preferably from about 1000 Angstroms to about 3000 Angstroms, most preferably about 2000 Angstroms. RF magnetron sputtering is a preferred method for providing the metal or metal oxide layer 116 over the barrier layer 114.

The patterned masking layer 18 may be any suitable material that (a) is capable of being patterned and (b) provides adequate etch selectivity with respect to the material of the metal or metal oxide layer over which it is disposed. Preferred materials for the patterned making layer are materials having these characteristics, and which further can be heated to temperatures above 250° C., more preferably 350–550° C. Examples of such materials include silicon dioxide (commonly SiO$_2$), silicon nitride (commonly Si$_3$N$_4$), titanium, titanium oxide, titanium nitride (commonly TiN), and mixtures of the same.

Titanium containing masks, particularly titanium, titanium oxide and titanium nitride containing masks, are preferred due to the superior selectivities that can be achieved using the same. The patterned masking layer 118 may be of any suitable thickness. The thickness of the patterned masking layer 118 can range, for example, from 500 Angstroms to 9000 Angstroms, more preferably from 2000 Angstroms to 7000 Angstroms, most preferably about 2000 to 3000 Angstroms. Techniques are known in the art for forming patterned masking layers 118. Details for forming such layers can be found, for example, in commonly assigned WO 00/49650 published Aug. 24, 2000 and entitled "Iridium Etching Methods for Anisotropic Profile", the entire disclosure of which is incorporated by reference.

Figure 1B:
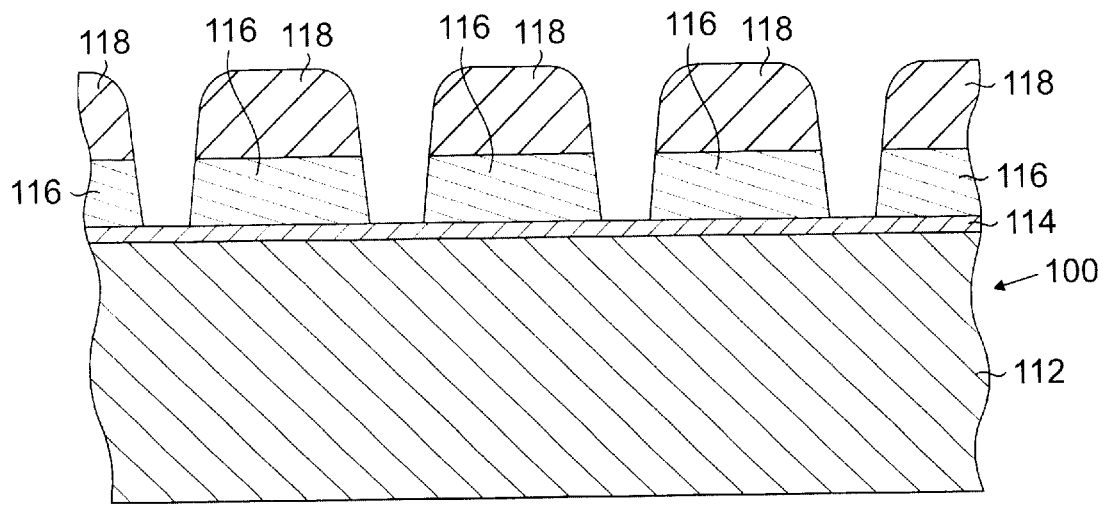

According to an embodiment of the invention, the metal or metal oxide layer 116 of FIG. 1A is subsequently etched through apertures in the patterned masking layer 118, resulting in a structure like that illustrated in FIG. 1B.

The metal or metal oxide layer 116 may be etched in any suitable plasma processing apparatus. Preferably, the plasma processing apparatus provides a high density plasma, which may be defined as a plasma having a density greater than about $10^{11}$ cm$^{-3}$, typically $5\times10^{10}$ to $5\times10^{12}$ cm$^{-3}$. The source of the high-density plasma may be any suitable high density source, such as electron cyclotron resonance (ECR), helicon resonance, or inductively coupled plasma (ICP) sources. Each of these is currently in use on semiconductor production equipment. The main difference is that ECR and helicon sources employ an external magnetic field to shape and contain the plasma, while inductively coupled plasma sources do not.

Figure 2:
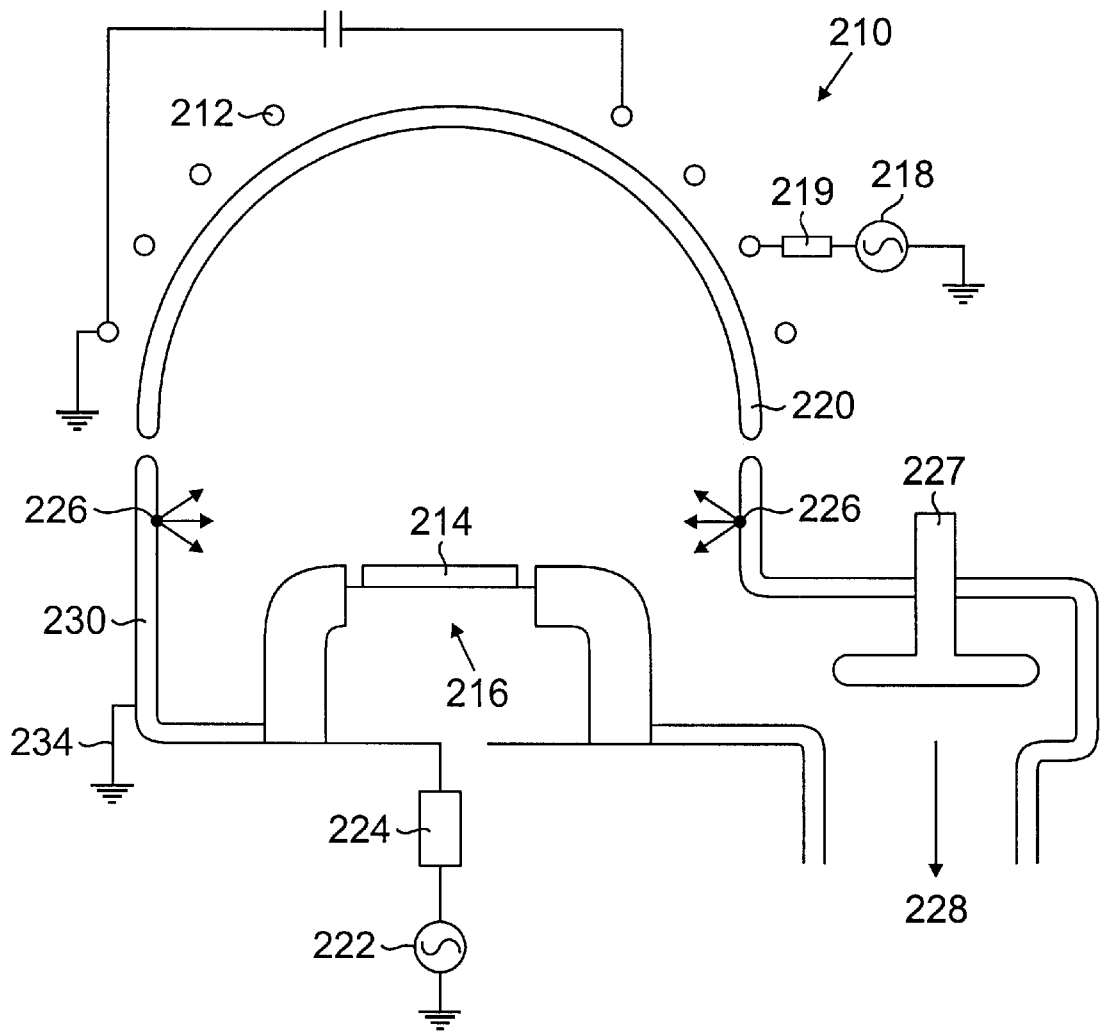
FIG. 2 is a schematic diagram of an exemplary etching system that may be used in connection with various embodiments of the invention.

Preferably, the metal or metal oxide layer 116 is etched in a plasma processing apparatus with an inductively coupled plasma source, more preferably a DPS (decoupled plasma source) etching system. A schematic diagram of one such system is found in FIG. 2. (This system s also disclosed in U.S. Pat. No. 6,074,954, the entire disclosure of which is incorporated by reference.) FIG. 2 illustrates an etching process chamber 210, which is constructed to include at least one inductive coil antenna segment 212 positioned exterior to a shaped dielectric ceiling 220 and connected to a radio frequency (RF) power generator 218 (which may be a source power generator with a frequency tunable for impedance matching at different plasma conditions, or which may be a source power generator of fixed frequency which is connected through an impedance matching network 219). Process chamber 210 also includes a substrate 214 on a support pedestal (cathode) 216, which is connected to an RF frequency power generator 222 (which may be a bias power generator at a fixed frequency) through an impedance matching network 224, and a conductive chamber wall 230, which serves as the electrical ground 234. The substrate 214 can be, for example, a wafer 100 like that illustrated in FIG. 1A and 1B.

The semiconductor substrate 214 is placed on the support pedestal 216 and gaseous components are fed into the process chamber through entry ports 226. A plasma is ignited in process chamber 210 by applying RF powers 218 and 222. Pressure within the etch process chamber 210 is controlled using a vacuum pump (not shown) and a throttle valve 227 situated between process chamber 210 and the vacuum pump by which species 228 are removed. The temperature on the surface of the etch chamber walls is controlled using liquid-containing conduits (not shown), which are located in the walls of the etch chamber 210. The surfaces of the etching chamber 210 walls are typically maintained at about 80° C., using the cooling conduits previously described.

The temperature of the semiconductor substrate is controlled by stabilizing the temperature of the support pedestal 216. Preferably, the support pedestal 216 is initially heated to bring the substrate to a desired elevated temperature (ranging, for example, from 250 to 550° C.). This heating can be accomplished, for example, by means of embedded copper resistance heating elements within the support pedestal. Once the plasma is ignited, however, the heat produced by the plasma typically requires some type of cooling mechanism for the pedestal. This may be accomplished by a variety of methods. Commonly, the pedestal electrostatically holds the substrate (e.g., semiconductor wafer) in place. Helium is then preferably charged (for example, to a pressure of 1 to 3 Torr) into channels formed by grooves on the pedestal 216 surface (not shown) and by the back of the substrate 214. The helium acts as a heat exchange medium, transferring heat from the substrate 214 to the support pedestal 216. Heat is ultimately removed from the pedestal 216, typically by means of a heat exchange apparatus associated with the pedestal 216, through which a coolant medium such as chilled glycol is circulated.

The RF power applied to the inductive coil antenna segment 212 (source power) and to the substrate pedestal 216 (bias power) may be selected to range, for example, from about 50 kHz to as high as 13.56 MHz, with a frequency of 2 MHz being preferred for the source power and 13.56 MHz being preferred for the bias power. Wattages can range from a few hundred watts to several thousand watts. The power applied to the substrate pedestal 216 may also be DC.

One particularly preferred plasma-processing chamber for carrying out the present invention is a DPS-series chamber available from Applied Materials, Inc. of Santa Clara, Calif. Where substrate heating is desired, such a chamber can be modified as described above.

The preferred plasma source gases for use in connection with the present invention include (a) one or more gases comprising a chlorine atom and (b) one or more gases comprising a carbon-oxygen bond.

Preferred gases comprising a chlorine atom for use in connection with the present invention include those chlorine containing gases that are commonly used for metal etching, such as molecular chlorine ($Cl_2$), carbon tetrachloride ($CCl_4$), silicon tetrachloride ($SiCl_4$) and boron trichloride ($BCl_3$). The chlorine containing gas is added as the primary etchant species.

Preferred gases that comprise a carbon-oxygen bond that are contemplated for use in connection with the present invention include gaseous oxides of carbon, such as carbon monoxide (CO) and carbon dioxide ($CO_2$). The inventors have found that by adding appropriate amounts of such gases, the selectivity of the overall mixture of etching gases is improved.

A mixture of $Cl_2$ and CO is one example of a beneficial combination of the above gases. For this combination, the $CO:Cl_2$ volume ratio is preferably greater than or equal to 1:1, more preferably ranging from 1:1 to 15:1. At lower ratios, it has been found that the resist selectivity begins to suffer. At higher ratios, etch rates begin to become undesirably low.

In addition to the above gases, one or more of the following gases can be added to the above plasma source gases in accordance with the certain embodiments of the present invention: (a) oxygen gas (i.e., $O_2$), (b) nitrogen gas (i.e., $N_2$) and (c) a gas from group VIIIA of the periodic table that has an atomic weight greater than or equal to that of argon (i.e., argon, krypton, and/or xenon gas).

It has been found that the addition of oxygen in small amounts will act to enhance the etch rate, but without the formation of conductive, tightly bonded deposits on the inside surface of the reactor as discussed above in the Background of the Invention. For this purpose, up to 20% oxygen (relative to the total volume of chlorine and carbon dioxide) is preferably added to the plasma source gases.

The addition of nitrogen has been found to make the sidewall profiles of the etched features more vertical. For this purpose, it is preferred to add up to 10% nitrogen to the plasma source gases, relative to the total volume of chlorine and carbon dioxide in the same.

The etch rate can also be increased by adding to the mixture of plasma source gases one or more of the gases from group VIIIA of the periodic table having an atomic weight greater than or equal to that of argon (i.e., argon, krypton, and/or xenon). Argon is a preferred gas from this group. Where used, up to 15% argon (relative to the total volume of chlorine and carbon monoxide) is preferably added to the plasma source gases.

The pressure within the reactor chamber may be at any appropriate level, with preferred reactor pressures ranging from 5 to 50 mTorr, and more preferably from 10–20 mTorr.

As noted above, the substrate support pedestal (cathode) can be maintained at a variety of temperatures, typically from −5 to 550° C., more preferably from 150 to 550° C., even more preferably 250 to 550° C., and still more preferably from 350 to 550° C. High cathode temperatures (typically 350–550° C.) are most preferred because they promote chemical reaction and they discourage deposition of by-products along the sidewalls of etched features. As a result, the etch rate is increased and the sidewalls of the etched features become more vertical.

For DPS etching systems like those discussed above, the source power preferably ranges from 900 to 1500 watts, more preferably 1200 to 1300 watts, while the bias power preferably ranges from 150 to 550 watts, more preferably 250 to 450 watts. In general, higher source and bias powers lead to enhanced etch rates. An increase in source power also typically leads to improved sidewall profiles, however, the source power is ultimately limited by a loss in mask selectivity.

EXAMPLE 1

A wafer comprising a silicon substrate having a silicon dioxide surface layer, a titanium nitride barrier layer, an iridium metal layer and a patterned titanium nitride hard mask is provided as discussed above in connection with FIG. 1A. The wafer is then etched using a DPS-series etching system like that described above. Preferred process parameters are as follows:

Chamber Pressure: 10 to 20 mTorr
RF bias power: 250 to 450 watts
RF source power: 1150 to 1350 watts
RF bias frequency: 13.56 MHz
RF source frequency: 2 MHz
Temperature of pedestal: 300 to 400° C.
Helium pressure: 1 to 3 Torr
$Cl_2$ flow rate: 15–30 sccm (standard cubic centimeters per minute)
CO flow rate: 50–150 sccm
$O_2$ flow rate: 5–30 sccm
$N_2$ flow rate: 10–20 sccm
Argon flow rate (if desired): 10–30 sccm Stable iridium etch rates ranging, for example, from 400 to 1000 Angstroms/minute can be achieved by this process. The etched iridium features that are formed by this process are repeatable and are relatively vertical (with sidewall tapers of about 80°, for example). Selectivity is also good, with iridium: mask selectivities (as measured at the mask shoulder) ranging from 2:1 to 10:1 being readily obtainable. Iridium: mask selectivities of 4 to 6 are typical, due to the trade-off between mask selectivity and iridium etch rate.

This process results in some deposition of by-products upon the inside reactor surfaces. These by-products are either non-conductive or only slightly conductive, and they are easily removed using common solvents such as de-ionized water, isopropyl alcohol, acetone, etc., as well as mixtures of the same (e.g., a mixture of water and isopropyl alcohol has been found to be effective).

Although the present invent has been described with respect to several exemplary embodiments, there are many other variations of the above-described embodiments that will be apparent to those skilled in the art. It is understood that these variations are within the teachings of the present invention, which is to be limited only by the claim appended hereto.

For example, all of the features disclosed in this specification (including any accompanying claims, abstract and drawings), and/or all of the steps of any method or process so disclosed, may be combined in any combination, except for combinations where at least some of the features and/or steps are mutually exclusive.

Moreover, each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A method comprising:
   providing a wafer, said wafer comprising: (a) a semiconductor substrate, (b) a metal or metal oxide layer over said semiconductor substrate, and (c) a titanium containing patterned mask layer over said metal or metal oxide layer, said patterned mask layer having one or more apertures formed therein; and
   etching said metal or metal oxide layer through said apertures in said mask layer by a plasma etching step, wherein said plasma etching step is conducted using plasma source gases comprising: (a) a gas that comprises one or more chlorine atoms and (b) a gas that comprises one or more carbon-oxygen bonds.

2. The method of claim 1, wherein said gas that comprises one or more carbon-oxygen bonds is selected from CO gas d $CO_2$ gas.

3. The method of claim 1, wherein said gas that comprises one or more chlorine atoms is selected from $Cl_2$ gas, carbon tetrachloride gas, silicon tetrachloride gas and boron trichloride gas.

4. The method of claim 1, wherein said gas that comprises one or more carbon-oxygen bonds is CO gas and wherein said gas that comprises one or more chlorine atoms is $Cl_2$ gas.

5. The method of claim 4, wherein a ratio of CO gas to $Cl_2$ gas ranges from 1:1 to 15:1.

6. The method of claim 1, wherein said plasma source gases further comprise $O_2$ gas.

7. The method of claim 6, wherein said $O_2$ gas is provided in an amount ranging from 0.1% to 20%.

8. The method of claim 1, wherein said plasma source gases further comprise $N_2$ gas.

9. The method of claim 8, wherein said $N_2$ gas is provided in an amount ranging from 0.1% to 10%.

10. The method of claim 1, wherein said plasma source gases further comprise one or more noble gases selected from argon gas, krypton gas and xenon gas.

11. The method of claim 1, wherein said plasma etching step is conducted at a pressure ranging from 5 to 50 mTorr.

12. The method of claim 1, wherein said wafer is heated to a temperature ranging from 250 to 550° C. during said plasma etching step.

13. The method of claim 1, wherein said semiconductor substrate is a silicon substrate.

14. The method of claim 1, wherein said metal or metal oxide layer comprises one or more metals selected from platinum, iridium, ruthenium, palladium, rhodium and osmium.

15. The method of claim 1, wherein said metal or metal oxide layer comprises one or more metal oxides selected from iridium oxide and ruthenium oxide.

16. The method of claim 1, wherein said mask layer comprises one or more materials selected from titanium metal, titanium oxide and titanium nitride.

17. The method of claim 1, wherein said plasma is a high-density plasma.

18. The method of claim 1, wherein said wafer further comprises: (a) a semiconductor oxide layer disposed on said semiconductor substrate, and (b) a barrier layer disposed between said semiconductor oxide layer and said patterned mask layer.

19. The method of claim 18, wherein said barrier layer is selected from a titanium layer and a titanium nitride layer.

20. A method comprising:
   providing a wafer, said wafer comprising: (a) a semiconductor substrate, (b) a platinum family metal layer over said semiconductor substrate, and (c) a patterned mask layer comprising titanium, titanium oxide or titanium nitride over said platinum family metal layer, said patterned mask layer having one or more apertures formed therein; and
   etching said platinum family metal layer through said apertures in said mask layer by a plasma etching step, wherein said plasma etching step is conducted using plasma source gases comprising $Cl_2$ gas and CO gas, and wherein said wafer is heated to a temperature ranging from 250 to 550° C.

21. The method of claim 20, wherein a ratio of CO gas to $Cl_2$ gas ranges from 1:1 to 15:1.

22. The method of claim 20, wherein said plasma source gases further comprise $O_2$ gas and $N_2$ gas.

23. The method of claim 22, wherein said $O_2$ gas is provided in an amount ranging from 0.1% to 20% and wherein said $N_2$ gas is provided in an amount ranging from 0.1% to 10%.

24. The method of claim 20, wherein said plasma etching step is conducted at a pressure ranging from 5 to 50 mTorr.

25. The method of claim 20, wherein said plasma is a high-density plasma.

* * * * *